(12) United States Patent
Kurihara et al.

(10) Patent No.: US 6,177,226 B1
(45) Date of Patent: *Jan. 23, 2001

(54) POSITIVE PHOTORESIST COMPOSITION AND PROCESS FOR FORMING CONTACT HOLE

(75) Inventors: Masaki Kurihara; Satoshi Niikura, both of Kanagawa; Miki Kobayashi, Chiba; Kousuke Doi, Kanagawa; Hidekatsu Kohara, Kanagawa; Toshimasa Nakayama, Kanagawa, all of (JP)

(73) Assignee: Tokyo Ohka Kogyo Co., Ltd., Kanagawa (JP)

( * ) Notice: Under 35 U.S.C. 154(b), the term of this patent shall be extended for 0 days.

This patent is subject to a terminal disclaimer.

(21) Appl. No.: 09/069,074

(22) Filed: Apr. 29, 1998

(30) Foreign Application Priority Data

May 1, 1997 (JP) .................................. 9-114020

(51) Int. Cl.[7] ........................................ G03F 7/023
(52) U.S. Cl. .................... 430/191; 430/165; 430/192; 430/193
(58) Field of Search .................. 430/192, 193, 430/165, 191

(56) References Cited

U.S. PATENT DOCUMENTS

| | | | |
|---|---|---|---|
| 5,407,779 | * 4/1995 | Uetani et al. | 430/192 |
| 5,429,905 | * 7/1995 | Tan et al. | 430/192 |
| 5,609,982 | * 3/1997 | Sato et al. | 430/192 |
| 5,667,932 | * 9/1997 | Sato et al. | 430/192 |
| 5,700,620 | * 12/1997 | Sakaguchi et al. | 430/191 |
| 5,728,504 | * 3/1998 | Hosoda et al. | 430/192 |
| 5,750,310 | * 5/1998 | Sato et al. | 430/192 |
| 5,853,948 | * 12/1998 | Sawano et al. | 430/166 |
| 5,912,102 | * 6/1999 | Kawata et al. | 430/191 |

FOREIGN PATENT DOCUMENTS

| | | | |
|---|---|---|---|
| 6-167805 | 6/1994 | (JP) | G03F/21/022 |
| 9-96904 | 4/1997 | (JP) | G03F/7/022 |

* cited by examiner

*Primary Examiner*—John S. Chu
(74) *Attorney, Agent, or Firm*—Wenderoth, Lind & Ponack, L.L.P.

(57) ABSTRACT

A positive photoresist composition for forming a contact hole which comprises (A) an alkali-soluble resin; (B) a naphthoquinonediazide group-containing compound; and (C) a solvent, wherein the ingredient (B) comprises: at least one naphthoquinonediazidesulfonic ester of a polyphenol compound, where said polyphenol compound is composed of from 4 to 6 benzene rings each bonding via a methylene chain, each of the methylene chains is in a meta position to other methylene chains, and each of the benzene rings has a hydroxyl group is provided. According to the present invention, a positive photoresist composition and a process for forming a contact hole can be provided each of which gives a contact hole pattern image in exact accordance with a mask pattern without dimple formation, in the contact hole forming technologies using the phaseshift method.

2 Claims, No Drawings

POSITIVE PHOTORESIST COMPOSITION AND PROCESS FOR FORMING CONTACT HOLE

BACKGROUND OF THE INVENTION

1. Field of the Invention

The present invention relates to a positive photoresist composition and a process for forming a contact hole. More particularly, it relates to a positive photoresist composition for forming a contact hole, which provides a contact hole pattern image having less dimples and being in exact accordance with a mask pattern in the formation of contact holes with the use of the phaseshift technique. Additionally, it relates to a process for forming such contact holes.

2. Description of the Related Art

In manufacturing processes for semiconductor devices such as an integrated circuit (IC) and large-scale integrated circuit (LSI), and for liquid-crystal devices such as a liquid-crystal display (LCD), a positive photoresist composition comprising an alkali-soluble resin and a compound containing a quinonediazide group as a material having satisfactorily high definition, sensitivity and etching resistance is practically used.

Recently, a photolithography (optical lithography) technique using a reducing-type projection alignment method has markedly improved sensitivity of such a photoresist. With an increasing integration of 4-M, 64-M and then 256-M integration, integrated circuits require elements having still finer or smaller sizes on the order of a wavelength of a ray (0.3 to 0.5 $\mu$m) used to print an element pattern. Accordingly, in production processes of integrated circuits, conventional photolithography techniques using an i-line (365 nm) reaches its limitation upon improvement of definition, and hence there are demands for technologies to improve definition of photoresists.

As an example of such technologies, attempts have been made to change a source to any of shorter wavelength rays such as excimer laser beams from KrF, ArF or the like, or electron beams, X-rays or other rays. These techniques have not yet been widely employed because they require change of equipment, involving enormous increase in its cost. To this end, there are demands for techniques to enhance definition at a low cost without change of a source. As an illustrative example, there has been proposed a phaseshift method ("Technologic Innovation in USLI Lithography", pp. 34–40, issued by Science Forum Ltd., Nov. 19, 1994).

The phaseshift method involves a process for emphasizing contrast of a ray which transmits an aperture (a ray-transmittable portion) by processing a mask substrate for printing a circuit pattern on a photoresist film so as to allow phase of the ray to shift partly. A mask substrate to which the phaseshift technique is not applied is composed of apertures (ray-transmittable portions) that transmit a ray and masking portions which do not. As rays transmit via apertures and diffuse, such diffused rays overlap each other in case of a fine pattern, and hence fail to give separate patterns (that is, definition is deteriorated). The phaseshift technique provides partial phaseshift of rays, emphasizes contrast of the rays and hence improves definition.

The phaseshift method includes spatial frequency modulation type (Levenson type), edge reinforcement type, multi-phase transmittance control type and other types of techniques. Of these techniques, the edge reinforcement type technique and the multi-phase transmittance control type technique are favorable for the formation of contact hole patterns. Particularly, it is thought that the multi-phase transmittance control type technique using a halftone mask will become useful one.

Use of the halftone mask has been widely reported, and disclosed, for instance, in Japanese Patent Laid-Open Nos. 8-137089, 8-171196, 8-279452 and others.

Further, Japanese Patent Laid-Open No. 9-96904 discloses a positive photoresist composition for forming contact hole.

The halftone mask is a mask obtained by composing its masking portions of a translucent film that transmit rays in a transmittance of several percents, while such masking portions are generally composed of a chromium film which does not transmits rays. This construction allows a ray transmitted via an aperture and another ray transmitted via the masking portion composed of the translucent film to be in reversed or opposite phase to each other, and hence sharpens a light intensity distribution of a main pattern, since such reversed phase rays counteract each other. Thus, it gives a contact hole pattern having a high contrast and an improved definition.

Most of these halftone masks and other phaseshift masks are, however, disadvantageous in that they cause the formation of sub-patterns of ray, that is, so-called side lobes, in the periphery of a main pattern (Japanese Patent Laid-Open No. 8-222513). Though such side lobes have a weaker light intensity than in a main pattern, they invite, upon the formation of a fine pattern, the formation of concaves, namely, so-called dimples in other portions than the main pattern (i.e., photoresist-coated portions corresponding to the side lobes) after development. These dimples deteriorate characteristics or properties of the photoresist film and cause defects such as interconnection failure.

SUMMARY OF THE INVENTION

Accordingly, it is an object of the present invention to provide a positive photoresist composition for forming a contact hole which provides a contact hole pattern image having less dimples and being in exact accordance with a mask pattern, and a process for forming a contact hole using the photoresist composition.

In the above-described circumstances, the present inventors earnestly conducted several investigations, and could solve the conventional problems as mentioned above.

To be more specific, the present invention provides a positive photoresist composition for forming a contact hole which comprises:

(A) an alkali-soluble resin;

(B) a naphthoquinonediazide group-containing compound; and (C) a solvent, wherein the ingredient (B) comprises:

at least one naphthoquinonediazidesulfonic ester of a polyphenol compound, where the polyphenol compound is composed of from 4 to 6 benzene rings each bonding via a methylene chain, each of the methylene chains is in a meta position to the other methylene chains, and each of the benzene rings has a hydroxyl group.

Further, the present invention provides a positive photoresist composition for forming a contact hole which comprises:

(A) an alkali-soluble resin;
(B) a naphthoquinonediazide group-containing compound; and
(C) a solvent,
wherein the ingredient (B) is a mixture comprising:
  at least one naphthoquinonediazidesulfonic ester of a polyphenol compound, where the polyphenol compound is composed of from 4 to 6 benzene rings each bonding via a methylene chain, each of the methylene chains is in a meta position to the other methylene chains, and each of the benzene rings has a hydroxyl group, and
  a naphthoquinonediazidesulfonic ester of a hydroxy compound represented by the following formula:

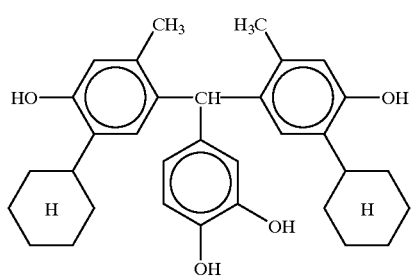

The present invention further provides the above-mentioned positive photoresist composition which further comprises (D) at least one polyphenol compound being composed of from 4 to 6 benzene rings each bonding via a methylene chain, each of the methylene chains is in a meta position to the other methylene chains, and each of the benzene rings has a hydroxyl group.

In addition, the present invention provides the aforementioned positive photoresist composition, wherein the ingredient (B) comprises:
  from 15 to 30% by weight of at least one naphthoquinonediazidesulfonic ester of a polyphenol compound, where the polyphenol compound is composed of from 4 to 6 benzene rings each bonding via a methylene chain, each of the methylene chains is in a meta position to the other methylene chains, and each of the benzene rings has a hydroxyl group, and
  from 60 to 85% by weight of a naphthoquinonediazidesulfonic ester of a hydroxy compound represented by the following formula:

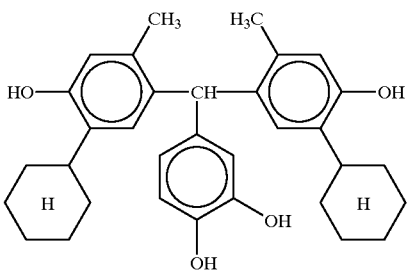

The present invention still further provides the positive photoresist composition, wherein the polyphenol compound is a compound represented by either of the following formulae (I) or (II):

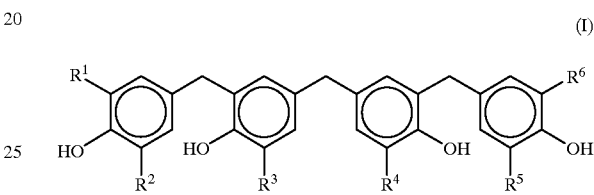

(I)

wherein each of $R^1$, $R^2$, $R^3$, $R^4$, $R^5$ and $R^6$ is independently a substituted or unsubstituted alkyl group, alkenyl group or alkoxy group each having from 1 to 5 carbon atoms, or

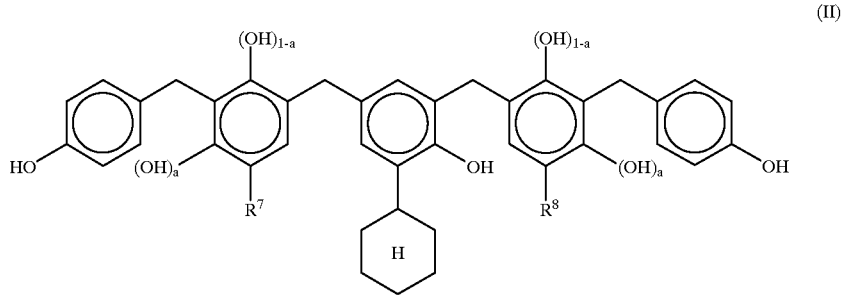

(II)

wherein each of $R^7$ and $R^8$ is independently a substituted or unsubstituted alkyl group, alkenyl group or alkoxy group each having from 1 to 5 carbon atoms, and the repetition number "a" is 0 or 1.

In addition, the present invention provides the positive photoresist composition, wherein the naphthoquinoneazidesulfonic ester of the polyphenol compound of the formula (I) or (II) is substantially a triester.

The present invention further provides the positive photoresist composition, wherein the polyphenol compound is a compound represented by the following formula (III):

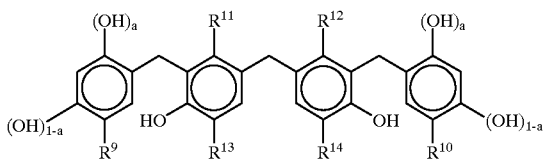

(III)

wherein each of $R^9$ and $R^{10}$ is respectively a hydrogen atom or an alkyl group, alkenyl group or alkoxy group each having from 1 to 5 carbon atoms, each of $R^{11}$, $R^{12}$, $R^{13}$ and $R^{14}$ is independently an alkyl group or alkenyl group each having from 1 to 3 carbon atoms, and the repetition number "a" is 0 or 1.

In addition and advantageously, the present invention provides a process for forming a contact hole by the phaseshift method which process comprises:

using a photoresist film that satisfies the following formula:

$$Ed>Eop$$

wherein Ed is a minimum exposure time period to form a dimple when a 0.30 μm-diameter hole pattern is formed on a photoresist film having a thickness of 1 μm, and Eop is an exposure time period to faithfully obtain a hole pattern having a diameter of 0.30 μm on the photoresist film.

The present invention still further provides the aforementioned process for forming a contact hole, wherein a photoresist film being composed of the above-mentioned positive photoresist composition is used.

DESCRIPTION OF THE PREFERRED EMBODIMENT (A) Alkali-soluble Resin

An alkali-soluble resin used as the ingredient (A) is not limited and can be chosen from those generally used as film-forming substances in positive photoresist compositions. Of these resins, condensates of aromatic hydroxy compounds and aldehydes or ketones, polyhydroxystyrenes and their derivatives are suitable.

The aromatic hydroxyl compounds include, for example, phenol, m-cresol, p-cresol, o-cresol, 2,3-xylenol, 2,5-xylenol, 3,5-xylenol, 3,4-xylenol and other xylenols; m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol and other alkyl-substituted phenols; p-methoxyphenol, m-methoxyphenol, p-ethoxyphenol, m-ethoxyphenol, p-propoxyphenol, m-propoxyphenol and other alkoxy-substituted phenols; o-isopropenylphenol, p-isopropenylphenol, 2-methyl-4-isopropenylphenol, 2-ethyl-4-isopropenylphenol and other isopropenylphenols; phenylphenol and other aryl-substituted phenols; 4,4'-dihydroxybiphenyl, bisphenol A, resorcinol, hydroquinone, pyrogallol and other polyhydroxyphenols. These resins can be used singly or in combination.

As suitable examples of the aldehydes, there may be mentioned formaldehyde, paraformaldehyde, trioxane, acetaldehyde, propionaldehyde, butylaldehyde, trimethylacetaldehyde, acrolein, crotonaldehyde, cyclohexanecarbaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, p-chlorobenzaldehyde, cinnamaldehyde and the like. Each of these compounds may be used independently or in combination.

Practical examples of the ketones include acetone, methyl ethyl ketone, diethyl ketone, and diphenyl ketone. These ketones may be used singly or in combination. Further, an optional combination of any of aldehydes and any of ketones can be employed.

The condensate of an aromatic hydroxy compound and an aldehyde or a ketone can be prepared in the presence of an acidic catalyst according to a known technique. Such an acidic catalyst includes, for instance, hydrochloric acid, sulfuric acid, formic acid, oxalic acid, p-toluenesulfonic acid and the like.

As the polyhydroxystyrenes and their derivatives, there may be mentioned, for example, vinylphenol homopolymers, copolymers of vinylphenol and a copolymerizable comonomer. Such a comonomer includes acrylic acid derivatives, acrylonitrile, methacrylic acid derivatives, methacrylonitrile, styrene, α-methylstyrene, p-methylstyrene, o-methylstyrene, p-methoxystyrene, p-chlorostyrene and other styrene derivatives.

Of these alkali-soluble resins used in the present invention as the ingredient (A), novolak resins obtained from a phenol compound such as m-cresol, p-cresol, 2,5-xylenol, 3,5-xylenol, 2,3,5-trimethylphenol, and an aldehyde such as formaldehyde are advantageously used since they are effective in achieving high thermostability. Further, low molecular weight fractions of the novolak resin may be removed. The weight average molecular weight of the novolak resin should fall within 2,000 to 25,000, preferably 2,500 to 20,000 and more preferably 6,500 to 8,000, while the resin should comprise no low molecular weight fraction. The term "weight average molecular weight" as used herein is defined as the value in terms of polystyrene measured by gel permeation chromatography (GPC).

The removal of low molecular weight fractions can be conducted by fractionation or other treatments. The fractionation is carried out by, for example, a process of dissolving a resin obtained by condensation in a good solvent and adding the resultant solution into water to thereby form precipitates. The good solvent includes, for instance, methanol, ethanol and other alcohols, acetone, methyl ethyl ketone and other ketones, ethylene glycol monoethylether acetate, and tetrahydrofuran.

(B) Naphthoquinonediazide Group-containing Compound.

The composition of the present invention specifies the ingredient (B) as above. The term "specify" used herein does not mean that the ingredient (B) should be one single component but that at least one specific ingredient (B) should only be included in the composition, and that other components in addition to the specific component may be incorporated in the composition.

The ingredient (B) used in the aforementioned embodiment is specified to a naphthoquinonediazidesulfonic ester of a polyphenol compound (hereinafter referred to as "linear polyphenol compound"), where the polyphenol compound is composed of from 4 to 6 benzene rings each bonding via a methylene chain, each of the methylene chains is in a meta position to the other methylene chains, and each of the benzene rings has a hydroxyl group. The content of the ester component is from 10 to 100% by weight, preferably from 12 to 60% by weight and more preferably from 15 to 30% by weight. As the polyphenol compound, the compound shown by the formula (I) may preferably used, including a terminal xylenol-type linear tetranuclear compound such as bis[3-(3,5-dimethyl-4-hydroxybenzyl)-4-hydroxy-5-methylphenyl]methane (A1) shown by the formula:

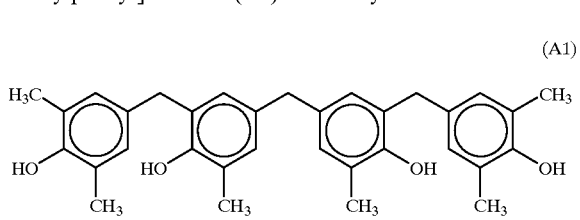

bis[3-(3,5-dimethyl-4-hydroxybenzyl)-4-hydroxy-5-ethylphenyl]methane (A2), bis[3-(3,5-diethyl-4-hydroxybenzyl)-4-hydroxy-5-methylphenyl]methane (A3), bis[3-(3,5-diethyl-4-hydroxybenzyl)-4-hydroxy-5-ethylphenyl]methane (A4) and the like.

The polyphenol compound represented by the formula (II) can also advantageously be employed. Such polyphenol compound includes, for instance, linear polyphenol compounds including pentanuclear compounds, such as 2,4-bis[2-hydroxy-3-(4-hydroxybenzyl)-5-methylbenzyl]-6-cyclohexylphenol (B1) represented by the following formula:

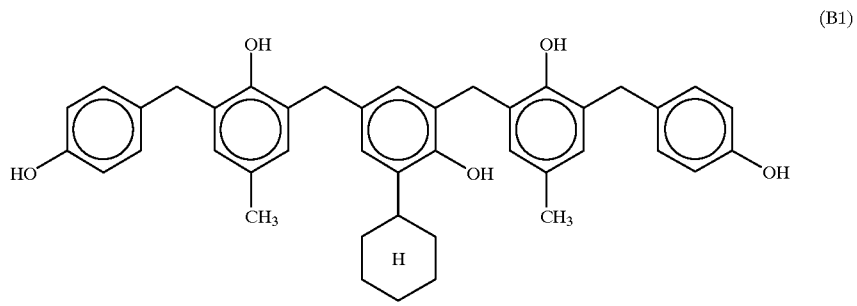

and 2,4-bis[4-hydroxy-3-(4-hydroxybenzyl)-5-methylbenzyl]-6-cyclohexylphenol (B2) represented by the following formula:

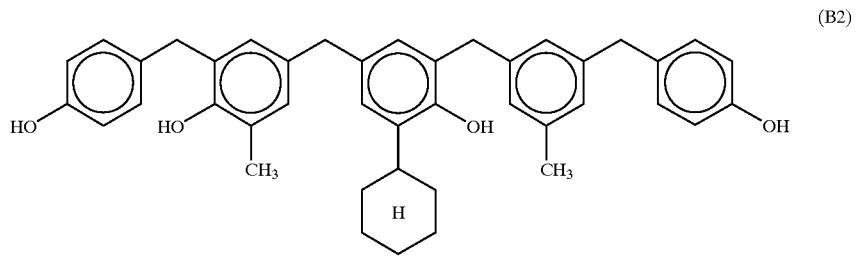

As examples of the other polyphenol compounds, there may be mentioned linear tetranuclear compounds such as bis[2-hydroxy-3-(3,5-dimethyl-4-hydroxybenzyl)-5-methylphenyl]methane (C1), bis[2-hydroxy-3-(2-hydroxy-5-methylbenzyl)-5-methylphenyl]methane (D1) and bis[4-hydroxy-3-(2-hydroxy-5-methylbenzyl)-5-methylphenyl]methane (E1), each represented by the following formulae:

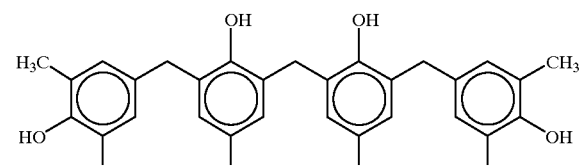

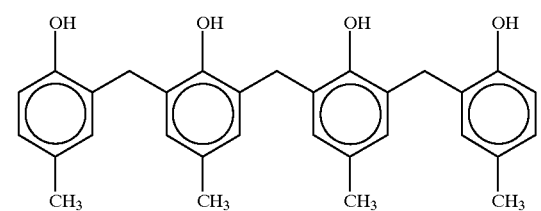

(E1)

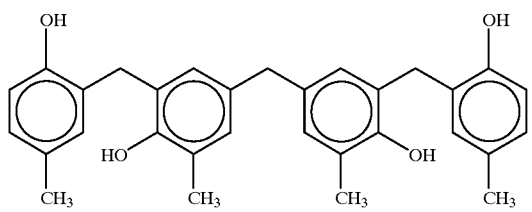

(K2)

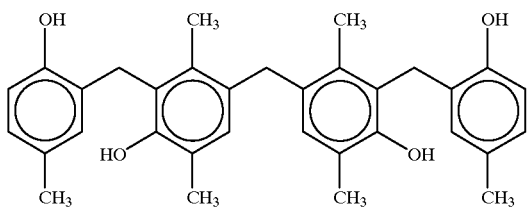

(K3)

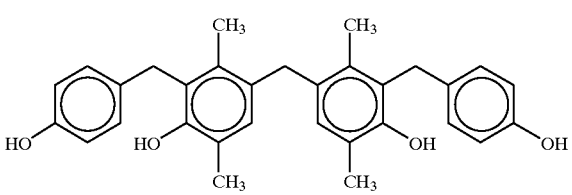

(K4)

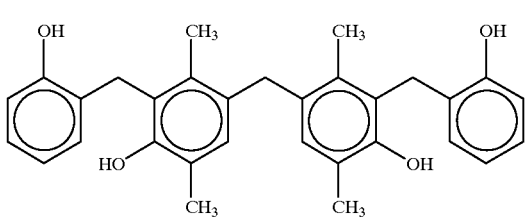

The term "linear" used in the present specification means a state in which a benzene ring bonds via a methylene chain in a meta-position bonding state.

Of these compounds, the terminal-xylenol-type linear tetranuclear compounds A1 to A4, and the linear pentanuclear compound B2 are suitable, among which Compound A1 is typically preferable.

It is preferable that the naphthoquinonediazidesulfonic ester of the aforementioned linear polyphenol compounds is substantially a triester. The term "substantially a triester" used in the present specification means that the ester is rich in triester components, and that peak area ratio of triesters is comparatively larger than any of peak area ratios of other mono-, di- and tetraesters, as measured at a wavelength of 254 nm by high performance liquid chromatography.

To be more practical, the ratio of triester:monoester:diester:tetraester falls in the range of 30 to 100%:0 to 25%:0 to 25%:0 to 25% (peak area ratio). In particular, the ester component advantageously comprises 35 to 50% of triesters based on the total peak area ratio. The ester component rich in monoesters and diesters as against triesters causes dimple formation and deteriorates contrast and focal depth range profile. To the contrary, the ester component rich in tetraesters and pentaesters as against triesters markedly impairs sensitivity. The triester can be obtained by adjusting, in a reaction, molar ratio of the linear polyphenol compound to a naphthoquinonediazidesulfonyl halide. To be more specific, the triester can be obtained by reacting 1 mole of the polyphenol compound with 3 moles of a naphthoquinonediazidesulfonyl halide.

As the polyphenol compound, compounds shown by the formula (III) can also preferably used. The compounds of the formula (III) includes, for instance, linear tetranuclear compounds such as bis[2,5-dimethyl-3-(4-hydroxy-5-methylbenzyl)-4-hydroxyphenyl]methane (K1), bis[2,5-dimethyl-3-(2-hydroxy-5-methylbenzyl)-4-hydroxyphenyl]methane (K2), bis[2,5-dimethyl-3-(4-hydroxybenzyl)-4-hydroxyphenyl]methane (K3), bis[2,5-dimethyl-3-(2-hydroxybenzyl)-4-hydroxyphenyl]methane (K4), each shown by the following formulae:

(K1)

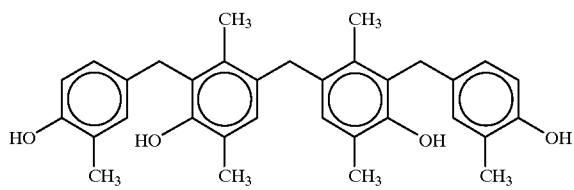

Of these compounds, Compounds (K1) and (K2) are typically suitable.

It is preferable that the naphthoquinonediazidesulfonic ester of the compound shown by the formula (III) is substantially a diester. The term "substantially a diester" as used in this specification means that the ester component is rich in diesters, and that the peak area ratio of the diester is comparatively larger than any of peak area ratios of other mono-, tri- and tetraesters, as mentioned above.

To be more practical, the peak area ratio of diester:monoester:triester:tetraester preferably falls within the range of 50 to 100%:0 to 30%:0 to 30%:0 to 30%. In particular, the ester component comprises 80 to 100% of the diester based on the total peak area ratio.

The ester component rich in monoesters as compared with diesters causes dimple formation and hence deteriorates contrast and focal depth range profile. On the other hand, triesters and tetraesters cannot be obtained in yield of more than 30%, due to their constructions.

The ingredient (B) may be incorporated with any of other quinonediazidesulfonic esters in addition to the aforementioned naphthoquinonediazidesulfonic esters. Such quinonediazidesulfonic esters include, for instance, esters of halides and hydroxy compounds of naphthoquinonediazidesulfonyl halides, orthobenzoquinonediazidesulfonyl halides, or orthoanthraquinonediazidesulfonyl halides. Of these, typically preferable include esters of naphthoquinone-1,2-diazide sulfonyl halides such as naphthoquinone-1,2-diazide-5-sulfonyl chloride, naphthoquinone-1,2-diazide-4-sulfonyl chloride, naphthoquinone-1,2-diazide-6-sulfonyl chloride and the like, and hydroxy compounds.

Examples of the hydroxy compound include the following compounds (i) to (iii):

(i) 2,3,4-trihydroxybenzophenone, 2,4,4'-trihydroxybenzophenone, 2,4,6- trihydroxybenzophenone, 2,3,4,4'-tetrahydroxybenzophenone, 2,2',4,4'-tetrahydroxybenzophenone, 2,3',4,4',6-pentahydroxybenzophenone, 2,2', 3,4,4'-pentahydroxybenzophenone, 2,2',3,4,5'-tetrahyd roxybenzophenone, 2,3',4,5,5'-pentahydroxybenzophenone, 2,3,3',4,4',5'-hexahydroxybenzophenone and other polyhydroxybenzophenones;

(ii) hydroxyaryls represented by the following formula (IV):

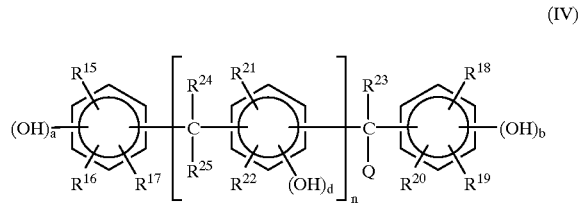

(IV)

wherein each of $R^{15}$ to $R^{22}$ independently denotes a hydrogen atom, a halogen atom, an alkyl group having from 1 to 6 carbon atoms, an alkoxy group having from 1 to 6 carbon atoms, or a cycloalkyl group; each of $R^{23}$ to $R^{25}$ independently denotes a hydrogen atom or an alkyl group having from 1 to 6 carbon atoms; Q is a hydrogen atom, an alkyl group having from 1 to 6 carbon atoms, or Q forms, together with $R^{23}$, a cyclic ring having from 3 to 6 carbon atoms, or Q is a residue shown by the following formula:

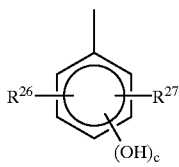

wherein each of $R^{26}$ and $R^{27}$ independently denotes a hydrogen atom, a halogen atom, an alkyl group having from 1 to 6 carbon atoms, an alkoxy group having from 1 to 6 carbon atoms or a cycloalkyl group; c is an integer of from 1 to 3; each of "a" and "b" is an integer of from 1 to 3; d is an integer of from 0 to 3; and n is an integer of from 0 to 2;

(iii) phenols such as phenol, p-methoxyphenol, dimethylphenol, hydroquinone, bisphenol A, naphthol, pyrocatechol, pyrogallol monomethyl ether, pyrogallol-1,3-dimethyl ether, gallic acid, and partially-esterified or partially-etherified gallic acid.

The naphthoquinonediazidesulfonic esters can be obtained by, for example, subjecting the naphthoquinone-1,2-diazidesulfonyl halide and the linear polyphenol compound or hydroxy compound to condensation reaction for complete esterification or partial esterification. The condensation reaction may advantageously be conducted in an organic solvent such as dioxane, N-methylpyrrolidone or dimethylacetamide, in the presence of a basic condensing agent including triethanolamine, alkali carbonates and alkali hydrogencarbonates. As the ester of hydroxy compound, use of an ester obtained by condensing not less than 50% by mole, preferably not less than 60% by mole of, for instance, naphthoquinone-1,2-diazide-4(or 5-)-sulfonyl halide relative to the total mole of hydroxy groups in the hydroxy compound (i.e., an ester having an esterification rate of not less than 50%, and preferably not less than 60%) is advantageous for still higher definition.

Incidentally, the hydroxy compound may be esterified partially in its hydroxyl groups with other sulfonyl halide than the naphthoquinonediazidesulfonyl halide, as described in Japanese Patent Application No. 8-130773. To be more specific, an ester of a compound shown by the following formula (V), a naphthoquinonediazidesulfonyl halide and hydroxy compound may preferably be employed as the photosensitive component:

$R^{28}$—SO$_2$—X (V)

wherein $R^{28}$ is an alkyl group, a substituted alkyl group, an alkenyl group, an aryl group or a substituted aryl group, and X is a halogen atom. Practical examples of compound represented by formula (V) are methanesulfonyl chloride, methanesulfonyl fluoride, ethanesulfonyl chloride, n-propanesulfonyl chloride, n-butanesulfonyl chloride, pentanesulfonyl chloride, dodecanesulfonyl chloride and other alkane sulfonyl halides each having from 1 to 12 carbon atoms; chloromethylsulfonyl chloride, dichloromethylsulfonyl chloride, trichloromethylsulfonyl chloride, 2-chloroethylsulfonyl chloride and other substituted alkane sulfonyl halides each having from 1 to 12 carbon atoms; ethylenesulfonyl chloride, 1-propene-1-sulfonyl chloride and other alkene sulfonyl halides each having 2 or 3 carbon atoms; benzenesulfonyl chloride, benzenesulfonyl fluoride, benzylsulfonyl chloride, 1-naphthalenesulfonyl chloride and other aryl sulfonyl halides; p-toluenesulfonyl chloride, p-ethylbenzenesulfonyl chloride, p-styrenesulfonyl chloride, p-methoxybenzenesulfonyl chloride and other alkyl-, alkenyl- or alkoxy-substituted aryl sulfonyl halides.

Of these hydroxy compounds (i) to (iii), typically preferred compounds are those represented by the formula (IV), among which specifically suitable is bis(3-cyclohexyl-4-hydroxy-6-methylphenyl)-3,4-dihydroxyphenylmethane (F1) represented by the following formula:

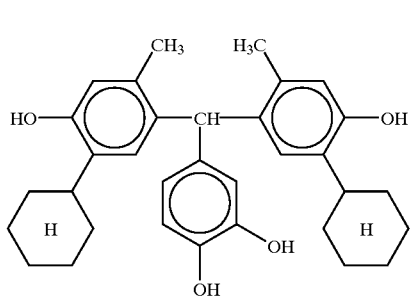

(F1)

and/or 1-[1-(4-hydroxyphenyl)isopropyl]-4-[1,-bis(4-hydroxyphenyl)ethyl]benzene (G1) shown by the following formula:

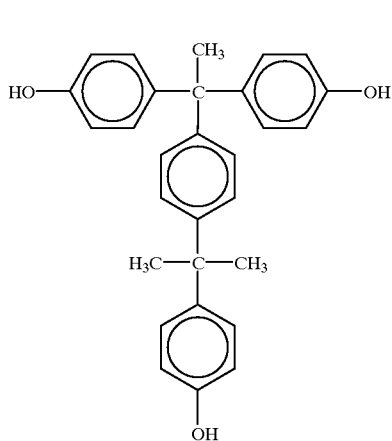

(G1)

In particular, naphthoquinone-1,2-diazidesulfonic ester of Compound F1 is advantageous.

Combination use with any of esters of Compounds F1 and/or G1, in particular of Compound F1 improves sensitivity and focal depth range profile in comparison to a single use of any of naphthoquinonediazide esters of the linear polyphenol compound.

The compounding ratio of these compounds is from 5 to 95% by weight and preferably from 60 to 85% by weight to the weight of the ingredient (B).

The ingredient (D) plays a role a sensitizer. It preferably comprises at least one polyphenol compound (the linear polyphenol compound) composed of from 4 to 6 benzene rings each bonding via a methylene chain, each of the methylene chains is in a meta position to other methylene chains, and each of the benzene rings has a hydroxyl group. The polyphenol compounds are those as described above, among which Compounds A1 to A4, B1 to B2, C1, D1 and E1 are suitable. In particular, Compound A1 is more advantageously employed. These polyphenol compounds may be incorporated in a ratio of from 10 to 100% by weight, preferably from 20 to 70% by weight based on the total weight of the ingredient (D).

The linear polyphenol compound is preferably incorporated into the composition as the sensitizer (D) to further suppress dimple formation. The ingredient (D) may be composed of any of other sensitizers in addition to the linear polyphenol compounds. Suitable examples of the other sensitizers include hydroxyaryls of the formula (IV), such as bis(4-hydroxy-2,3,5-trimethylphenyl)-2-hydroxyphenylmethane, 1,4-bis[1-(3,5-dimethyl-4-hydroxyphenyl)isopropyl]benzene, 2,4-bis(3,5-dimethyl-4-hydroxyphenylmethyl)-6-methylphenol, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, 1-[1-(4-hydroxyphenyl)isopropyl]-4-[1,1-bis(4-hydroxyphenyl)ethyl]benzene, 1-[1-(3-methyl-4-hydroxyphenyl)isopropyl]-4-[1,1-bis(3-methyl-4-hydroxyphenyl)ethyl]benzene, 2,6-bis[1-(2,4-dihydroxyphenyl)isopropyl]-4-methylphenol, 4,6-bis[1-(4-hydroxyphenyl)isopropyl]resorcin, 4,6-bis(3,5-dimethoxy-4-hydroxyphenylmethyl)pyrogallol, 4,6-bis(3,5-dimethyl-4-hydroxyphenylmethyl)pyrogallol, 2,6-bis(3-methyl-4,6-dihydroxyphenylmethyl)-4-methylphenol, 2,6-bis(2,3,4-trihydroxyphenylmethyl)-4-methylphenol, 1,1-bis(4-hydroxyphenyl)cyclohexane and the like. Of these compounds, typically preferred are 2,4-bis(3,5-dimethyl-4-hydroxyphenylmethyl)-6-methylphenol (H1) shown by the following formula:

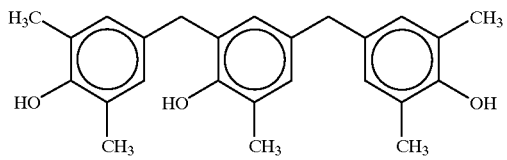

(H1)

and 1,4-bis[1-(3,5-dimethyl-4-hydroxyphenyl)isopropyl] benzene (I1) shown by the following formula:

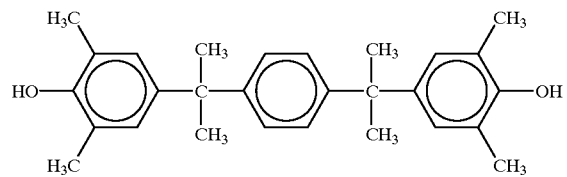

(I1)

Next, the contents of the ingredients (A), (B) and (D) are now described.

The content of the ingredient (B) may preferably fall within from 5 to 100% by weight and more preferably from 20 to 45 percent by weight relative to the total weight of the alkali-soluble resin, the ingredient (A), and the ingredient (D) added if desired. Use of the ingredient (B) less than 5% by weight fails to provide an image being exactly with a pattern and deteriorates transfer property (printing property). On the other hand, an excess content deteriorates sensitivity, and decreases homogeneity of a resist film to be formed and definition.

The ingredient (D) may preferably be incorporated in a content of from 5 to 60% by weight and more preferably from 20 to 50% by weight relative to the alkali-soluble resin component, the ingredient (A).

The composition of the present invention may preferably be incorporated with, as the ingredient (E), any of the sulfonyl halides of the formula (V). Typical examples of the ingredient (E) include methanesulfonyl chloride, methanesulfonyl fluoride, ethanesulfonyl chloride, n-propanesulfonyl chloride, n-butanesulfonyl chloride, pentanesulfonyl chloride, dodecanesulfonyl chloride and other alkane sulfonyl halides each having from 1 to 12 carbon atoms; chloromethylsulfonyl chloride, dichloromethylsulfonyl chloride, trichloromethylsulfonyl chloride, 2-chloroethylsulfonyl chloride and other substituted alkane sulfonyl halides each having from 1 to 12 carbon atoms; ethylenesulfonyl chloride, 1-propene-1-sulfonyl chloride and other alkene sulfonyl halides each having 2 or 3 carbon atoms; benzenesulfonyl chloride, benzenesulfonyl fluoride, benzylsulfonyl chloride, 1-naphthalenesulfonyl chloride and other aryl sulfonyl halides; and p-toluenesulfonyl chloride, p-ethylbenzenesulfonyl chloride, p-styrenesulfonyl chloride, p-methoxybenzenesulfonyl chloride and other alkyl-, alkenyl-, or alkoxy-substituted aryl sulfonyl halides. Of these compounds, the alkane sulfonyl halides, aryl sulfonyl halides and alkyl-substituted aryl sulfonyl halides are suitable since they will give well-balanced sectional shape, exposure margin and focal depth range. Among them, benzylsulfonyl chloride, naphthalenesulfonyl chloride and p-toluenesulfonyl chloride (PTSC) are particularly preferred.

Use of the ingredient (E) further enhances suppressing activity against dimple formation.

The ingredient (E) may be added in a content of from about 0.01 to about 2.00% by weight, preferably from about 0.05 to about 1.00% by weight relative to the total solid contents. With a content of less than 0.01% by weight, dimple formation will not be satisfactorily suppressed. On the other hand, with an excess content, solubility in developer around the surface of an exposed portion will be inferior to thereby inhibit the formation of contact holes or to deteriorate the hole shape. Therefore, a content within the range of from 0.50 to 1.00% by weight is typically preferred.

The composition of the present invention may preferably further comprise, as the ingredient (F), an improving agent for definition, exposure margin and film residual rate, with 1,4-bis[1-(3-cyclohexyl-4-hydroxy-6-methylphenyl) isopropyl]benzene (Z1) represented by the following formula:

(Z1)

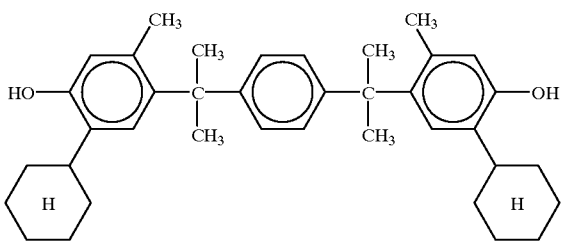

The content of Ingredient (F) may preferably fall within 0.5 to 5.0% by weight, more preferably 1.0 to 3.0% by weight relative to the total solid contents.

In addition to the above specified ingredients, where necessary, the composition of the present invention may further comprise any of compatible additives including, for example, ultraviolet absorbents for inhibition of halation and surfactants for prevention of striation within a range not adversely affecting the objects of the present invention. Examples of the ultraviolet absorbents include 2,2',4,4'-tetrahydroxybenzophenone, 4-dimethylamino-2',4'-dihydroxybenzophenone, 5-amino-3-methyl-1-phenyl-4-(4-hydroxyphenylazo)pyrazole, 4-dimethylamino-4'-hydroxyazobenzene, 4-diethylamino-4'-ethoxyazobenzene, 4-diethylaminoazobenzene and curcumin. As the surfactants, there may be mentioned, for instance, Fluorade FC-430 and FC-431 (trade names, manufactured by Sumitomo 3M Corporation, Japan), F-TOP EF122A, EF122B, EF122C and EF126 (trade names, Tochem Products Ltd., Japan) and other fluorine-containing surfactants.

The composition of the present invention may preferably be used as a solution obtained by dissolving each of the above-specified ingredients in the ingredient (C), a proper solvent.

Practical examples of the solvent include those used in conventional positive photoresist compositions, such as acetone, methyl ethyl ketone, cyclohexanone, methyl isoamyl ketone, 2-heptanone and other ketones; ethylene glycol, propylene glycol, diethylene glycol, ethylene glycol monoacetate, propylene glycol monoacetate, diethylene glycol monoacetate, or their monomethyl ethers, monoethyl ethers, monopropyl ethers, monobutyl ethers or monophenyl ethers and other polyhydric alcohols and their derivatives; dioxane and other cyclic ethers; and ethyl lactate, methyl acetate, ethyl acetate, butyl acetate, methyl pyruvate, ethyl pyruvate, methyl methoxypropionate, ethyl ethoxypropionate and other esters. Each of these compounds may be used solely or in combination. Of these compounds, typically preferred are acetone, methyl ethyl ketone, cyclohexanone, methyl isoamyl ketone, 2-heptanone and other ketones; and ethyl lactate, methyl acetate, ethyl acetate, butyl acetate, methyl pyruvate, ethyl pyruvate, methyl methoxypropionate, ethyl ethoxypropionate and other esters.

Practically, the positive photoresist composition of the present invention may be used, for example, in the following manner: The photoresist composition is dissolved in a solvent to give a coating solution; the coating solution is then applied onto a substrate such as a silicon wafer using a spinner, and subsequently dried to form a photosensitive film; next, the photosensitive film is irradiated and exposed with an ultraviolet ray source such as a low-pressure mercury lamp, a high-pressure mercury lamp, an ultra-high-pressure mercury lamp, an arc lamp, or a xenon lamp, through a phaseshift mask drawn with a contact hole pattern; and the exposed portions of the film are then dissolved and removed by dipping in a developer solution, for example, an alkaline aqueous solution such as a 1 to 10% by weight tetramethylammonium hydroxide (TMAH) aqueous solution, thus forming a hole pattern image having less dimples and being in exact accordance with the mask pattern.

As described above, in the present invention, use is made of the naphthoquinonediazide sulfonic ester of polyphenol compound being composed of from 4 to 6 benzene rings each bonding via a methylene chain, where each of the methylene chains is in a meta position to other methylene chains, and each of the benzene rings has a hydroxyl group. Addition of naphthoquinonediazidesulfonic ester of the polyphenol compound excellently inhibits dimple formation in the phaseshift method. In particular, even when a fine hole pattern on the order of submicron or finer is formed on a photoresist film having a thickness of 1 μm, Ed is more than Eop, and a contact hole pattern in exact accordance with the mask pattern can be formed without dimple formation.

EXAMPLES

The present invention will be further illustrated in detail with reference to the examples below.

Each of the characteristics of the positive photoresist compositions was evaluated according to the following manner, respectively.

[Dimple Margin]

A sample was applied onto a silicon wafer using a spinner, and dried on a hot plate at 90° C. for 90 sec. to form a resist film having a thickness of 1.05 μm. The resist film was then selectively irradiated for an increasing period from 0.5 sec. at intervals of 0.03 sec. using a reducing-type projection aligner NSR2005i10D (manufactured by Nikon Corporation, Japan; NA=0.63, δ=0.40) and a halftone mask (manufactured by Toppan Printing Co., Ltd., Japan; transmittance of 8%) corresponding to a hole diameter of 0.35 μm and having a duty ratio of 2:1 (i.e., an interval between one hole and another was 0.70 μm). The film was then post-expose baked (PEB) at 110° C. for 90 sec.; subjected to development in a 2.38% by weight tetramethylammonium hydroxide aqueous solution at 23° C. for 60 sec., washed with water for 30 sec., and dried. In this procedure, the dimple margin was defined as Ed/Eop, where the exposure time period to give dimples after development was defined as Ed, and the exposure time period to faithfully obtain a hole pattern of a diameter of 0.30 μm was defined as Eop, each of which was measured in the unit of millisecond (ms).

[Sectional Shape]

The contact hole pattern having a diameter of 0.30 μm was subjected to an SEM (scanning electron microscopy) photographic observation of the sectional shape. The sectional shape was defined as the relationship between an aperture (T) of the top opening and an aperture (B) of the bottom of the hole pattern, and evaluated according to the following criteria:

Excellent: T nearly equals B
Fine: somewhat T>B or T<B
Inferior: T>>B
Poor: T<<B

[Focal Depth Range]

A sample was subjected to exposure and development using a reducing-type projection aligner NSR-2005i10D (manufactured by Nikon Corporation, Japan; NA=0.63, δ=0.40) at an exposure of Eop (the exposure time period to form a 0.30 μm-contact hole) as a standard exposure, where the focus was shifted up and down at this exposure. The obtained contact hole pattern was subjected to an SEM photographic observation. Based upon the SEM photograph, the focal depth range was defined as the maximum value (μm) of the focal shift to obtain a contact hole pattern having a diameter of 0.30 μm.

[Sensitivity Measurement]

A sample was applied onto a silicon wafer using a spinner, and dried on a hot plate at 90° C. for 90 sec. to form a resist film having a thickness of 1.05 μm. The resist film was then irradiated for an increasing period from 0.5 sec. at intervals of 0.03 sec. using a reducing-type projection aligner NSR-2005i10-D (manufactured by Nikon Corporation, Japan) and a halftone mask (manufactured by Toppan Printing Co., Ltd., Japan; transmittance of 8%) corresponding to a hole diameter of 0.35 μm and having a duty ratio of 2:1 (i.e., an interval between one hole and another was 0.70 μm). The film was then post-expose baked (PEB) at 110° C. for 90 sec.; subjected to development in a 2.38% by weight tetramethylammonium hydroxide aqueous solution at 23° C. for 60 sec., washed with water for 30 sec., and dried. The sensitivity (ms) was defined and measured as the exposure time period (Eop) to faithfully obtain a hole pattern of 0.30 μm in diameter.

Example 1

A positive photoresist composition was prepared as follows: Adequate amounts of m-cresol, p-cresol and 2,5-xylenol (4:4:2, by mole) was mixed, and the resultant mixture was subjected to condensation reaction with formaldehyde and salicylaldehyde in a conventional manner to form an alkali-soluble resin, and a low molecular weight fraction of the resin was removed to thereby give an alkali-soluble resin having a weight average molecular weight of 7,000. Another alkali-soluble resin having a weight average molecular weight of 7,000 was obtained from m-cresol and p-cresol (4:6, by mole) in the similar manner. The former and the latter resins were then admixed in a weight ratio of 3:1. Next, in 480 parts by weight of 2-heptane were dissolved 100 parts by weight of the above-obtained resin ingredient, 50 parts by weight of a photosensitizer obtained by mixing, in a weight ratio of 2:5, an ester A1(3) composed of 1 mole of bis[3-(3,5-dimethyl-4-hydroxybenzyl)-4-hydroxy-5-methylphenyl]methane (A1) and 3 moles of naphthoquinone-1,2-diazide-5-sulfonyl chloride (hereinafter referred to as "NQD"), and an ester F1(2) composed of 1 mole of bis(3-cyclohexyl-4-hydroxy-6-methylphenyl)-3,4-dihydroxyphenylmethane (F1) and 2 moles of NQD. The resultant solution was then filtered with a membrane filter having a pore size of 0.2 μm to thereby give a positive photoresist composition.

Example 2

A positive photoresist composition was formed in the same manner as Example 1, except that the resist composition further contained 30 parts by weight of the sensitizer A1.

Example 3

A positive photoresist composition was obtained in the same manner as Example 2, except for further adding 1.0 part by weight of p-toluenesulfonyl chloride (PTSC).

Example 4

A positive photoresist composition was prepared in the same manner as Example 3, except that the composition was further incorporated with 2 parts by weight of 1,4-bis[1-(3-cyclohexyl-4-hydroxy-6-methylphenyl)isopropyl]benzene (Z1).

Example 5

The procedure of Example 4 was repeated to thereby give a positive photoresist composition, except that in lieu of 50 parts by weight of the photosensitizer used in Example 4, 50 parts by weight of a photosensitizer obtained by mixing, in a weight ratio of 2:5, an ester B2(3) composed of 1 mole of 2,4-bis[4-hydroxy-3-(4-hydroxybenzyl)-5-methylbenzyl]-6-cyclohexylphenol (B2) and 3 moles of NQD, and an ester F1(2) composed of 1 mole of Compound F1 and 2 moles of NQD was used.

Example 6

A positive photoresist composition was prepared in the same manner as Example 4, except for using 50 parts by weight of a photosensitizer comprising a mixture of an ester C1(3) obtained from 1 mole of bis[2-hydroxy-3-(3,5-dimethyl-4-hydroxybenzyl)-5-methylphenyl]methane (C1) and 3 moles of NQD, and an ester F1(2) obtained from 1 mole of Compound F1 and 2 moles of NQD [C1(3):F1(2)= 2:5 (weight ratio)] in lieu of 50 parts by weight of the photosensitizer used in Example 4.

Example 7

A positive photoresist composition was obtained in the same manner as Example 4, except that, instead of 50 parts by weight of the photosensitizer used in Example 4, 50 parts by weight of a photosensitizer obtained by mixing an ester E1(3) composed of 1 mole of bis[4-hydroxy-3-(2-hydroxy-5-methylbenzyl)-5-methylphenyl]methane (E1) and 3 moles of NQD, and an ester F1(2) composed of 1 mole of Compound F1 and 2 moles of NQD [E1(3):F1(2)=2:5 (weight ratio)].

Example 8

A positive photoresist composition was prepared in the same manner as Example 4, except that 50 parts by weight of the photosensitizer used in Example 4 was changed to 50 parts by weight of a photosensitizer obtained by mixing an ester D1(3) composed of 1 mole of bis[2-hydroxy-3-(2-hydroxy-5-methylbenzyl)-5-methylphenyl]methane (D1) and 3 moles of NQD, and an ester F1(2) composed of 1 mole of Compound F1 and 2 moles of NQD [D1(3):F1(2)=2:5 (weight ratio)].

Example 9

A positive photoresist composition was obtained in the same manner as Example 4, except that a sensitizer B2 was used in lieu of the sensitizer A1 used in Example 4.

Example 10

A positive photoresist composition was prepared in the same manner as Example 4, except for employing an sensitizer C1 instead of the sensitizer A1 used in Example 4.

Example 11

The procedure of Example 4 was repeated to thereby obtain a positive photoresist composition, except that 50 parts by weight of a photosensitizer obtained by mixing an ester A1(2) composed of 1 mole of Compound A1 and 2 moles of NQD, and an ester F1(2) composed of 1 mole of Compound F1 and 2 moles of NQD [A1(2):F1(2)=2:5 (weight ratio)] was employed instead of 50 pats by weight of the photosensitizer used in Example 4.

Example 12

A positive photoresist composition was obtained in the same manner as Example 4, except that, in lieu of 50 parts by weight of the photosensitizer used in Example 4, 50 parts by weight of a photosensitizer obtained by mixing ester A1(4) composed of 1 mole of Compound A1 and 4 moles of NQD, and an ester F1(2) composed of 1 mole of Compound F1 and 2 moles of NQD [A1(4):F1(2)=2:5 (weight ratio)].

Example 13

A positive photoresist composition was prepared in the same manner as Example 4, except for employing 50 parts by weight of a photosensitizer obtained by mixing an ester A1(2) composed of 1 mole of Compound A1 and 2 moles of NQD, and an ester H1(2) composed of 1 mole of 2,4-bis(3,5-dimethyl-4-hydroxyphenylmethyl)-6-methylphenol (H1) and 2 moles of NQD [A1(2):H1(2)=2:5 (weight ratio)].

Example 14

A positive photoresist composition was obtained in the same manner as Example 1, except that 50 parts by weight of the photosensitizer used in Example 1 was changed to 50 parts by weight of an ester K1(2) obtained from 1 mole of Compound K1 and 2 moles of NQD.

Example 15

A positive photoresist composition was prepared in the same manner as Example 4, except for using 50 parts by weight of an ester K1(2) obtained from 1 mole of Compound K1 and 2 moles of NQD instead of 50 parts by weight of the photosensitizer used in Example 4.

Example 16

The procedure of Example 1 was repeated to thereby give a positive photoresist composition, except that 50 parts by weight of an ester K2(2) obtained from 1 mole of Compound K2 and 2 moles of NQD was used in lieu of 50 parts by weight of the photosensitizer used in Example 1.

Example 17

A positive photoresist composition was obtained in the same manner as Example 4, except for employing 50 parts by weight of an ester K2(2) obtained from 1 mole of Compound K2 and 2 moles of NQD instead of 50 parts by weight of the photosensitizer used in Example 4.

Example 18

A positive photoresist composition was prepared in the same manner as Example 17, except that 50 parts by weight of the ester K2(2) used as a photosensitizer in Example 17 was changed to 50 parts by weight of a photosensitizer obtained by mixing the esters K2(2) and F1(2) [K2(2):F1(2)=1:4 (weight ratio)].

Comparative Example 1

A positive photoresist composition was obtained in the same manner as Example 1, except for employing 50 parts by weight of ester F1(2) instead of 50 parts by weight of the photosensitizer used in Example 1, and employing a sensitizer H1.

Competitive Example 2

The procedure of Example 1 was repeated to thereby obtain a positive photoresist composition, except for using a photosensitizer H1(2) in lieu of the photosensitizer used in Example 1, and using a sensitizer H1, respectively.

Comparative Example 3

A positive photoresist composition was prepared in the same manner as Example 1, except for using an ester J1(2) obtained from 1 mole of 2,6-bis(3,5-dimethyl-4-hydroxyphenylmethyl)-4-methylphenol (J1) and 2 moles of NQD as a photosensitizer in lieu of photosensitizer used in Example 1, and using Compound J1 as an sensitizer.

The compounding ratio of each of the ingredients and the test results are set forth in Table 1.

TABLE 1

| EXAMPLES | photosensitizer 50 pbw | sensitizer 30 pbw | ingredient (E) (pbw) | ingredient (F) (pbw) | dimple margin (Ed/Eop) | sectional shape | focal depth range ($\mu m$) | sensitivity (ms) |
|---|---|---|---|---|---|---|---|---|
| 1 | A1(3):F1(2) = 2:5 | — | — | — | 1.01 | fine | 0.40 | 900 |
| 2 | " | A1 | — | — | 1.21 | fine | 0.80 | 480 |
| 3 | " | " | PTSC (1.0) | — | 1.29 | fine | 1.00 | 510 |
| 4 | " | " | " | Z1 (2) | 1.42 | excellent | 1.40 | 600 |
| 5 | B2(3):F1(2) = 2:5 | " | " | " | 1.25 | excellent | 1.20 | 660 |
| 6 | C1(3):F1(2) = 2:5 | " | " | " | 1.18 | fine | 1.00 | 420 |
| 7 | E1(3):F1(2) = 2:5 | " | " | " | 1.13 | fine | 1.00 | 450 |
| 8 | D1(3):F1(2) = 2:5 | " | " | " | 1.09 | fine | 1.10 | 510 |
| 9 | A1(3):F1(2) = 2:5 | B2 | " | " | 1.30 | excellent | 1.10 | 690 |
| 10 | " | C1 | " | " | 1.28 | excellent | 1.00 | 630 |
| 11 | A1(2):F1(2) = 2:5 | A1 | " | " | 1.08 | fine | 1.00 | 480 |
| 12 | A1(4):F1(2) = 2:5 | " | " | " | 1.03 | excellent | 1.00 | 840 |
| 13 | A1(2):H1(2) = 2:5 | A1 | PTSC (1.0) | Z1 (2) | 1.01 | inferior | 0.60 | 690 |
| 14 | K1(2) | — | — | — | 1.02 | fine | 0.50 | 900 |
| 15 | K1(2) | A1 | PTSC (1.0) | — | 1.43 | excellent | 1.80 | 600 |
| 16 | K2(2) | — | — | — | 1.02 | fine | 0.70 | 900 |
| 17 | K2(2) | A1 | PTSC (1.0) | Z1 (2) | 1.43 | excellent | 1.90 | 600 |
| 18 | K2(2):F1(2) = 1:4 | A1 | PTSC (1.0) | Z1 (2) | 1.45 | excellent | 1.95 | 500 |
| C.E. 1 | F1(2) | H1 | — | — | 0.50 | poor | 0.80 | 390 |

TABLE 1-continued

| EXAMPLES | photosensitizer 50 pbw | sensitizer 30 pbw | ingredient (E) (pbw) | ingredient (F) (pbw) | dimple margin (Ed/Eop) | sectional shape | focal depth range (µm) | sensitivity (ms) |
|---|---|---|---|---|---|---|---|---|
| C.E. 2 | H1(2) | H1 | — | — | 0.60 | inferior | 0.40 | 480 |
| C.E. 3 | J1(2) | J1 | — | — | 0.60 | inferior | 0.40 | 450 |

Note:
pbw = parts by weight
C.E. = Comparative Example
J1 = 2,6-bis(3,5-dimethyl-4-hydroxyphenylmethyl)-4-methylphenol According to the present invention, a positive photoresist composition and a process for forming a contact hole can be provided each of which gives a contact hole pattern image in exact accordance with a mask pattern without dimple formation, in the contact hole forming technologies using the phaseshift method.

While the invention has been described in detail and with reference to specific embodiments thereof, it will be apparent to one of ordinary skill in the art that various changes and modifications can be made therein without departing from the spirit and scope thereof.

What is claimed is:

1. A positive photoresist composition which comprises:

(A) an alkali-soluble resin;

(B) a naphthoquinonediazide group-containing compound;

(C) a solvent; and (D) at least one polyphenol compound being composed of from 4 to 6 benzene rings each bonding via a methylene chain, where each of the methylene chains is in a meta position to other methylene chains and each of the benzene rings has a hydroxyl group; wherein the ingredient (B) comprises:

at least one naphthoquinonediazidesulfonic ester of a polyphenol compound, where said polyphenol compound is composed of from 4 to 6 benzene rings each bonding via a methylene chain, each of the methylene chains is in a meta position to other methylene chains, and each of the benzene rings has a hydroxyl group.

2. A positive photoresist composition which comprises:

(A) an alkali-soluble resin;

(B) a naphthoquinonediazide group-containing compound;

(C) a solvent; and (D) at least one polyphenol compound being composed of from 4 to 6 benzene rings each bonding via a methylene chain, where each of the methylene chains is in a meta position to other methylene chains and each of the benzene rings has a hydroxyl group, wherein the ingredient (B) is a mixture comprising:

at least one naphthoquinonediazidesulfonic ester of a polyphenol compound, where said polyphenol compound is composed of from 4 to 6 benzene rings each bonding via a methylene chain, each of the methylene chains is in a meta position to other methylene chains, and each of the benzene rings has a hydroxyl group, and a naphthoquinonediazidesulfonic ester of a hydroxy compound represented by the following formula:

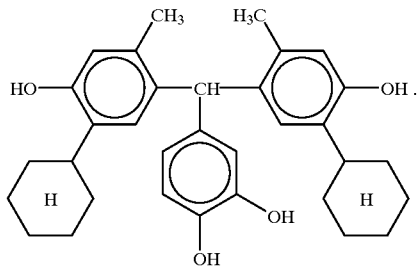

* * * * *